(12) United States Patent
Clothier

(10) Patent No.: US 8,324,719 B2
(45) Date of Patent: Dec. 4, 2012

(54) ELECTRONIC PACKAGE SYSTEM

(75) Inventor: Brent Allen Clothier, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 206 days.

(21) Appl. No.: 12/550,442

(22) Filed: Aug. 31, 2009

(65) Prior Publication Data

US 2011/0049697 A1    Mar. 3, 2011

(51) Int. Cl.
*H01L 23/48* (2006.01)
*H01L 23/34* (2006.01)

(52) U.S. Cl. ............... 257/690; 257/714; 257/E23.028; 257/E23.087; 257/723

(58) Field of Classification Search .............. 257/714, 257/690, E23.087, 723, E23.028
See application file for complete search history.

(56) References Cited

U.S. PATENT DOCUMENTS

| | | | |
|---|---|---|---|
| 4,236,129 A * | 11/1980 | Lacis et al. | 335/55 |
| 5,037,312 A * | 8/1991 | Casciotti et al. | 439/66 |
| 5,170,930 A * | 12/1992 | Dolbear et al. | 228/123.1 |
| 5,270,491 A | 12/1993 | Carnall, Jr. et al. | |
| 5,477,084 A | 12/1995 | Webb et al. | |
| 5,808,874 A | 9/1998 | Smith | |
| 5,847,396 A | 12/1998 | Lingren et al. | |
| 6,649,915 B2 * | 11/2003 | Wright et al. | 250/370.13 |
| 6,665,186 B1 * | 12/2003 | Calmidi et al. | 361/704 |
| 7,061,099 B2 * | 6/2006 | Lu et al. | 257/704 |
| 7,370,429 B2 * | 5/2008 | Hall | 33/366.11 |
| 2003/0080413 A1 * | 5/2003 | Dubhashi | 257/714 |
| 2005/0083781 A1 * | 4/2005 | Caren et al. | 366/220 |
| 2006/0220198 A1 | 10/2006 | Baskaran | |
| 2006/0274470 A1 | 12/2006 | Srinivasan et al. | |
| 2008/0052934 A1 * | 3/2008 | Hall | 33/366.11 |
| 2009/0001576 A1 * | 1/2009 | Tuli et al. | 257/750 |
| 2009/0317968 A1 * | 12/2009 | Nagata | 438/600 |
| 2010/0038770 A1 * | 2/2010 | Sheats | 257/690 |
| 2011/0014505 A1 * | 1/2011 | Bradwell et al. | 429/51 |

FOREIGN PATENT DOCUMENTS

EP    1477786 B1    11/2007

OTHER PUBLICATIONS

Thomas J. Kuczkowski, Donald H. Buckley, Lewis Research Center; Friction and Wear of Low-Melting Binary and Ternary Gallium Alloy Films in Argon and in Vacuum; NASA Technical Note—NASA TN D-2721; Mar. 1965; 16 Pages.

Safety Data Sheet acc, to Guideline 93/112/EC; Date: Sep. 14, 2006; Supersedes the Safety Data Sheet dtd, Apr. 5, 2004; 4 Pages.

Mr. Lee C. Cadwallader; Gallium Safety in the Laboratory; Idaho National Engineering and Environmental Laboratory; INEEL/CON-03-00078 Preprint; Jun. 21, 2003-Jun. 27, 2003; 10 Pages.

(Continued)

*Primary Examiner* — Nitin Parekh

(74) *Attorney, Agent, or Firm* — Paul J. DiConza

(57) ABSTRACT

Disclosed herein is an electronic package system utilizing a module having a liquid contact material to prevent mechanically and thermally induced strains in an electrical joint. The conductivity of the liquid contact material provides electrical communication between the required electronic components of the package system. The ability of the liquid contact material to flow prevents the creation of stresses and affords an electronic package design tolerant of small displacements or torsions. Thus, the liquid contact material enables a floating contact with high electrical reliability.

15 Claims, 4 Drawing Sheets

OTHER PUBLICATIONS

B.L.Aliyevsky, B.A.Bazarnov, A.M.Oktyabrsky, B,B.Popov, A.G. Sherstuk, D,P.Shopen; Superconductor Homopolar Machines With Liquid-Metal Contacts; LEEE Transactions on Magnetics, vol. 28, No. 1, Jan. 1992; pp. 287-290.

Avto Tavkhelidze, Zaza Taliashvili, Leri Tsakadze, Larissa Jangidze and Nodari Ushveridze; Liquid metal contact as possible element for thermotunneling; Tbilisi State University, 13 Chavchavadze ave., 0179 Tbilisi, Georgia; 9 Pages.

Andrew Cao, Phyllis Yuen, and Liwei Lin; Microrelays With Bidirectional Electrothermal Electromagnetic Actuators and Liquid Metal Wetted Contacts; Journal of Microelectromechanical Systems, vol. 16, No. 3, Jun. 2007; pp. 700-708.

G. N. Van Ingen, J. Kapteijn and J. L. Meijering; On the System Gallium-Indium-Tin, vol. 4, pp. 733-736, Date : 1970.

Ralph A. Burton and R. Gaines Burton; Properties and Performance of Gallium Alloys in Sliding Contacts; Burton Technologies Inc; pp. 187-192.

Search Report and Written Opinion from corresponding PCT Application No. PCT/US2010/039734 mailed on May 3, 2011.

* cited by examiner

US 8,324,719 B2

ELECTRONIC PACKAGE SYSTEM

BACKGROUND

The invention relates generally to a package system for an electronic device and particularly to a package system that incorporates liquid metal electrical joints to provide electrical conductivity and mechanical stability for an electronic element.

Electronic devices, especially mobile electronic devices, are often subjected to harsh mechanical forces, for example, shock and vibrations, and/or thermally induced stresses such as rapid changes in temperature, temperature gradients, or thermal cycling. Such conditions place exceptional strain on electrical joints that are typically formed by two dissimilar materials. If the electronic device is subject to impact, there is a possibility of normal, shear, and/or torsional forces transmitting into the joint, causing cracking or fracturing of the electronic device. Similarly, if the electronic device is moved from one temperature to another, differences in the thermal expansion or contraction of the varying materials induce stresses in the joint, which in turn, can create cracks in the electronic device.

Conventional approaches to decreasing mechanical and thermal stresses have emphasized novel joint geometries to reduce strain transmission and thus limit stress build-up. However, these approaches rely universally on a directly bonded solid-state joint (for example a solidified solder) to provide an electrical pathway, and as such, cannot completely mitigate mechanical and thermal stresses without reducing the fidelity of the electrical signal transmission.

Therefore, there is a need to design a package and method of providing robust electrical joints between components within the electronic device, while at the same time increasing the durability and reliability of the electronic package.

BRIEF DESCRIPTION

One embodiment of the present invention is an electronic package. The electronic package includes at least one module. The module comprises an electronic element, a bottom contact, and a liquid contact material in electrical communication with the electronic element and the bottom contact. The module also includes a fluid retention body surrounding a portion of the liquid contact material. The liquid contact material of the electronic package is characterized by having a liquidus temperature below 20° C.

Another embodiment of the present invention is an electronic package comprising at least one module. The module includes a top electrode, a semiconductor crystal, a gallium-based liquid contact material, a bottom contact, a bottom contact electrode, and a polytetrafluoroethylene (PTFE) fluid retention body. The top electrode is connected to external circuitry and the semiconductor crystal is in electrical communication with the top electrode. The bottom contact is connected to the external circuitry through the bottom contact electrode. The gallium-based liquid contact material is in electrical communication with the semiconductor crystal and the bottom contact. The fluid retention body comprising PTFE material surrounds a portion of the liquid contact material.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

In the following specification and the claims that follow, the singular forms "a", "an" and "the" include plural referents unless the context clearly dictates otherwise. Also the words such as "top", "bottom" are used while describing the parts in the figures and do limit the directions of the elements therein.

Various embodiments of the present invention describe a universal package design based on liquid contact materials.

One embodiment of the present invention uses a liquid contact material to substantially avoid mechanically- and thermally-induced strains in an electrical joint. The conductivity of the liquid contact material helps form and maintain electrical contact between the elements. In addition, the ability of the liquid contact material to flow prevents the creation of stresses and affords an electronic package design tolerant of small displacements or torsions. Thus, the liquid contact material enables a physical "floating" contact with high electrical reliability.

Figure 1:
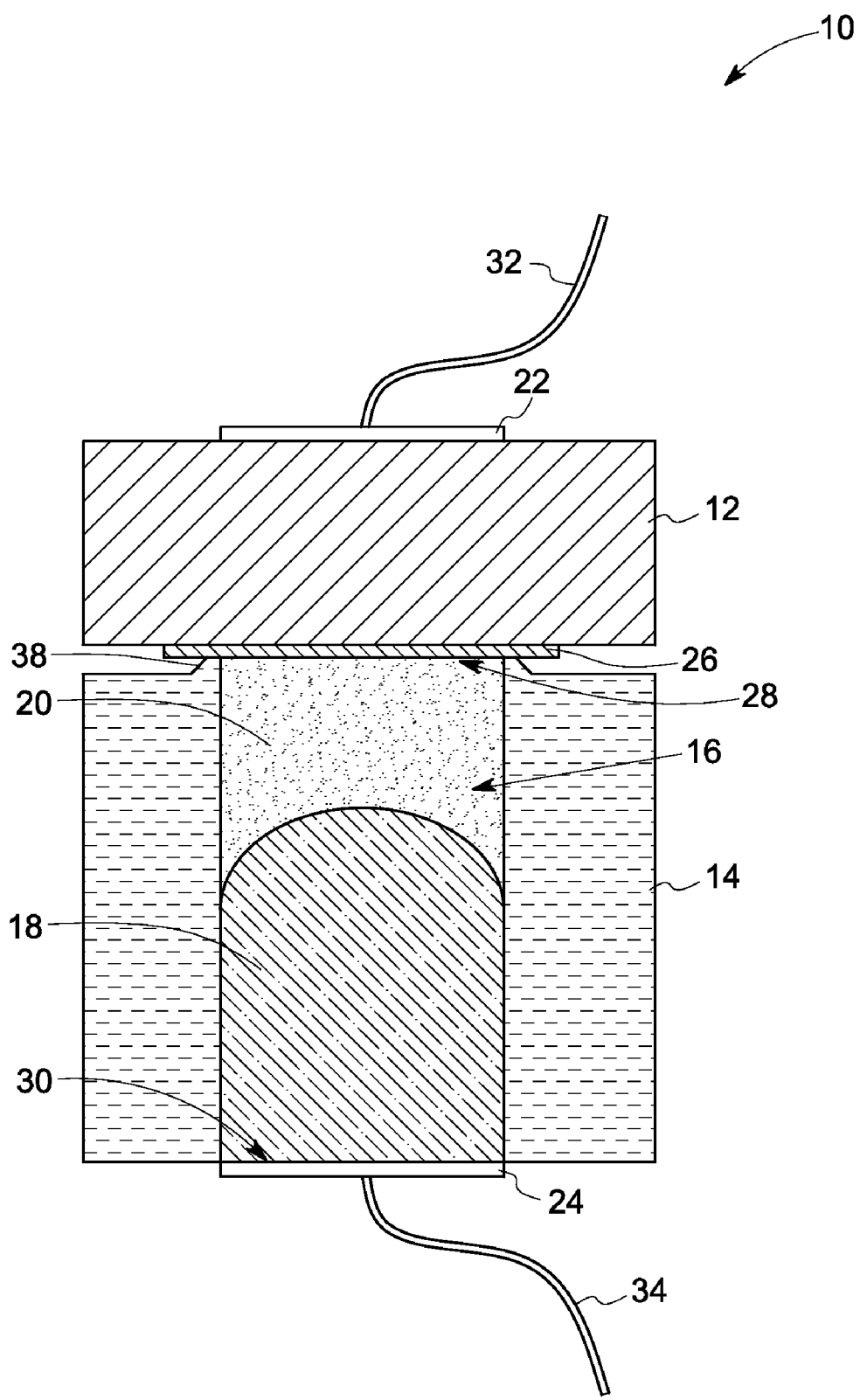
FIG. 1 is a cross-sectional view of an electronic package module in accordance with one embodiment of the present invention.

FIG. 1 depicts an electronic package module 10 including a liquid contact material in accordance with one embodiment of the present invention. The module 10 comprises an electronic element 12, a fluid retention body 14 having a cavity 16, a bottom contact 18, and a liquid contact material 20 disposed within the cavity 16. This configuration enables an electrical pathway between the electronic element 12 and bottom contact 18 through the liquid contact material 20. The bottom contact, while providing the electrical pathway, in one embodiment also serves as a plug to keep the liquid contact material in place within the cavity. The surface and shape of the plug along the interface with the liquid contact material can be chosen to provide a large contact area and leak-proof seal for the liquid contact material 20.

An optional bottom electrode 26 can be incorporated on the surface of the electronic element 12 interfacing with the liquid contact material 20. In one embodiment, the package system further comprises a top electrode 22, and an optional bottom contact electrode 24 to connect the electronic element 12 and the bottom contact 18, respectively, to external electrical circuitry through the electrical lead wires 32, 34. The fluid retention body 14 can have further design modifications such as, for example, a curved lip knife-edge 38 at an interface with the electronic element 12 or the optional bottom electrode 26 to prevent leakage without mechanically stressing the electronic element 12.

The electronic element 12 comprises an electronic material. In one embodiment, the electronic element 12 is a semiconductor crystal. In a further embodiment, the electronic element 12 comprises a cadmium zinc telluride crystal. Large $Cd_{1-x}Zn_xTe$ single crystals allow for the direct conversion of gamma radiation into electrical signals, enabling spectroscopic detectors of high-energy resolution. The "bulk" nature of such semiconducting crystals creates a significant mass that must be incorporated into the electronic device. If conventional electronic joints such as solder bumps are utilized during packaging, vibrations and jarring during normal handling can generate cracks in the brittle crystal, especially near the vicinity of the joint. The module design as depicted in FIG. 1 helps to prevent mechanically or thermally-induced strains, thereby creating a robust electronic package and permitting deployment in mobile and portable applications.

The fluid retention body 14 contains a cavity 16 of desired shape to hold the liquid contact material 20. In one embodiment, the fluid retention body 14 comprises two openings. A first opening 28 in the cavity allows the liquid contact material 20 to wet the electronic element 12, or the bottom electrode 26 if present, on its surface. The second opening 30 enables a bottom contact 18 to fit into the fluid retention body 14 thereby enabling wetting of the bottom contact 18 by the liquid contact material 20. The cavity of the fluid retention body 14 can be of any shape and size based on the requirement of the quantity and orientation of the liquid contact material with the electronic element 12 and the bottom contact 18. For example, if the electronic element 12 is an array of individual elements requiring contact with the liquid contact material 20, the liquid contact material will have to be contained in a cavity having a large opening so as to enable electrical communication with all the parts of the array of the electronic element 12. If the electronic element 12, or the array of individual elements comprising the electronic element 12, is at different orientation with respect to the fluid retention body, then the cavity can be designed in the shape and orientation facilitating the contact of the electronic element 12 with the liquid contact material 20. In one embodiment, the cavity of the fluid retention body 14, as illustrated in FIG. 1, is cylindrical in geometry. The cavity opening can be of a shape that allows effective wetting of the electronic element 12 for good electrical contact without any leakage. If the bottom electrode 26 is present, in one embodiment, the cavity opening can be made smaller than the bottom electrode's contacting surface. This configuration allows accommodation of small relative translations such as gliding while maintaining wetting of the electrode.

In one embodiment, the fluid retention body 14 comprises electronically insulating materials. In another particular embodiment, the fluid retention body 14 is made of a material that is chemically inert to the contained liquid contact material 20 and is sufficiently soft to minimize scratching or damaging the electronic element 12, or if present, the bottom electrode 26. When pressed flush against the electronic surface, the fluid retention body 14 provides a seal to prevent leakage, either through direct contact or through an intermediate body such as, for example, gaskets or o-rings. FIG. 1 illustrates a non-limiting design to achieve a seal as per one embodiment of the invention. The fluid retention body 14 of FIG. 1 has a raised curled-lip knife-edge 38 that readily deforms when pressed against the bottom electrode of the electronic element 12, forming a leak-proof seal.

Different materials, designs, and material and design combinations can be used for making a solid fluid retention body provided that the integrity of the electrical pathway through the liquid contact material is preserved. Examples include polymers, ceramics, metallic composites, or any combinations of these materials. In one embodiment, the solid fluid retention body 14 is made of a material having at least about $10^3$ times more resistivity than the resistivity of liquid contact material. In another embodiment, fluoropolymer materials are used for the fluid retention body 14. For example, the fluid retention body 14 can be made of polytetrafluoroethylene (PTFE).

The liquid contact material 20 performs the function of a conventional electrical joint that would otherwise directly bond the electronic element, or bottom electrode if present, to the bottom contact through a solid-state conducting material. Conventional electrical joints are poorly compatible with many high-value fragile and brittle electronic elements, and are susceptible to the transmission of mechanically- or thermally-induced stresses. The use of liquid contact material 20 forms an electrical pathway while mitigating mechanically- or thermally-induced strains. This feature has significant commercial value in hand-held, mobile, and portable electronic devices where operation in harsh and uncontrolled environments is common.

Liquid contact material 20 is generally a fluid at temperatures above its liquidus temperature. A liquidus temperature as used herein is a temperature at which a liquid begins to freeze. In one embodiment the liquid contact material 20 with a liquidus temperature less than that of room temperature is used for general electronic devices. In one embodiment, the liquid contact material 20 has a liquidus temperature less than 20° C. In another embodiment, the liquid material has a liquidus temperature less than 10° C. In yet another embodiment, the liquid material has a liquidus temperature less than 0° C.

The liquid contact material 20 generally comprises an electrically conductive fluid having a resistivity that is suitable for the transmission of electronic signals. In one embodiment, the resistivity of the liquid contact material 20 is less than or equal to about $10^2$ ohm-cm. In another embodiment, the resistivity is less than about $10^{-1}$ ohm-cm. In yet another embodiment, the resistivity of the liquid contact materials is less than about $10^{-3}$ ohm-cm.

In one embodiment, the liquid contact material 20 includes compositions and alloys of any of the following: alkali metals, alkaline-earth metals, transition metals, rare earth metals, and group 12-15 metals and metalloids. Non-limiting examples of liquid contact material 20 include materials containing one or more of the following: mercury (Hg), sodium-potassium (Na—K) alloys, gallium-based alloys, gallium-indium (Ga—In) alloys, and gallium-tin (Ga—Sn) alloys. In one embodiment, compositions from the Ga—In—Sn ternary system are used as the liquid contact material 20.

The Ga—In—Sn ternary system is advantageous as many of the alloy members display fluidity under standard ambient conditions with a select number retaining fluidity below 0° C. Some of these can be intermittently supercooled (i.e., cooled without solidifying) below −30° C. Such low freezing points enable a broad operating temperature for hand-held, mobile, and portable electronics that may require operation in cold environments. Further, the alloy members of this family exhibit resistivities close to that of copper. For example, the eutectic composition of Ga—In—Sn has a resistivity of about $3 \times 10^{-5}$ ohm-cm compared to the resistivity of about $2 \times 10^{-6}$ ohm-cm for copper (Cu). Thus, Ga—In—Sn compositions can provide a liquid contact material 20 having very high electrical reliability while causing minimal contributions to electronic noise. In another particular embodiment, an alloy comprising at least 65 atomic % Ga, at least 20 atomic % In, and at least 9 atomic % Sn is used as the liquid contact material 20. The liquidus temperature of the above mentioned ternary system is below 0° C.

As described earlier, the liquidus temperatures of a number of the Ga—In—Sn compositions are below 0° C. The boiling points of these compositions are normally above 1300° C.

thus leading to a wide liquid range for the Ga—In—Sn compositions. This wide liquid range, combined with a negligible vapor pressure, enable the Ga—In—Sn compositions to be subjected to the conventional processing techniques of electronic package such as, for example, wire and lead attachment through point soldering and reflow of solder pastes. This capability stands in contrast to liquid contact materials containing organic or aqueous based media that might boil or decompose, destroying the electrical joint.

The bottom contact 18 comprises a plug to contain the liquid contact material 20 within the cavity of the fluid retention body 14. This contact is electrically conductive and chemically compatible with the liquid contact material 20. In FIG. 1, the bottom contact 18 is illustrated as a cylindrical body with a spherical head, friction-fitted into the fluid retention body 14 to provide a leak-proof seal. Other geometries and attachment mechanisms such as threading, and slots, for example, are within the scope of this invention.

The bottom contact 18 serves to complete the electrical pathway from the electronic element 12, through the liquid contact material 20, to external circuitry. The bottom contact 18 therefore provides a solid interface point, enabling direct attachment of electrical leads or wires through known methods such as, for example soldering and ultrasonic joining. Non-limiting examples of bottom contact 18 materials include a platinum group material, copper, silver, gold, nickel, aluminum, tungsten, and their alloys. As used herein a platinum group material includes any metal or metals from the group consisting of platinum, palladium, rhodium, ruthenium, iridium and osmium.

The bottom electrode 26 can help to improve wetting by the liquid contact material 20 without substantially reducing the electrical conductivity between the electronic element 12 and the liquid contact material 20. Also, the bottom electrode can be used to inhibit or slow down corrosion or chemical etching of the electronic element 12 that may otherwise result from a direct contact of the electronic material with the liquid contact material 20. Non-limiting examples of the bottom electrode 26 material includes a platinum group material, gold, silver, nickel, aluminum, copper, tungsten and their alloys.

The bottom electrode 26 can be designed to be chemically compatible with both the electronic element 12 and the liquid contact material 20. The thickness of the bottom electrode 26 is chosen so as to not induce large mechanical stresses within the bottom electrode itself or with the electronic element 12, but at the same time is sufficiently thick to provide chemical protection of the electronic element 12 and improved workability of the system 10. For example, a large thickness can lead to cracking or delamination during transport or operation. In one embodiment, the thickness of the bottom electrode is less than ten micrometers and in another embodiment, the thickness of the bottom electrode is from about 0.1 micrometer to about 1 micrometer.

In one embodiment, the electronic package comprises a plurality of modules. In one embodiment, the modules are disposed in a pre-determined electrical communication network. In another embodiment, the modules can further be arrayed in series or parallel such that an array is now considered as a single device. In yet another embodiment, the electronic package includes individual modules comprising arrays of liquid contact materials, thus enabling the creation of a universal electronic package design for electronic elements.

Figure 2:
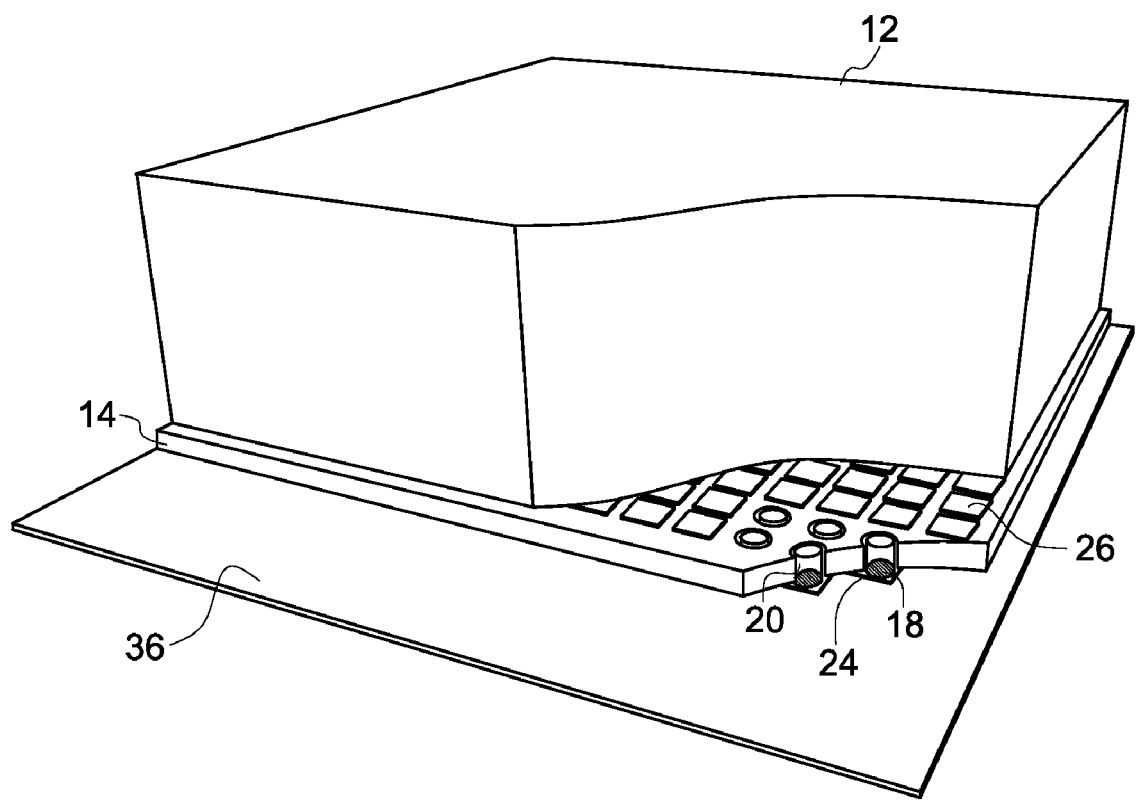
FIG. 2 is a cross-sectional view of an exemplary electronic package module in accordance with one embodiment of the present invention.

FIG. 2 depicts an exemplary electronic package module comprising an array of individual liquid contact materials 20 placed in electrical communication with the electronic element 12 and the bottom contacts 18 based on a substrate 36.

The "individual" liquid contact materials 20 as used herein need not be of different materials. The liquid contact materials can be comprised of the same materials base or different, depending on the application of the electronic package. The electronic element 12 and/or the substrate 36 can be a single element or the representation of an array of individual components depending on the application of the electronic package. The individual liquid contact materials 20 are contained and separated from each other through the fluid retention body 14. The individual liquid contact materials 20 are in electrical communication with the electronic element 12 through the individual top electrodes 26. The individual liquid contact materials 20 are in electrical communication with the optional bottom contact electrodes 24 disposed on the substrate 36 through the bottom contact 18.

EXAMPLE

Figure 3:
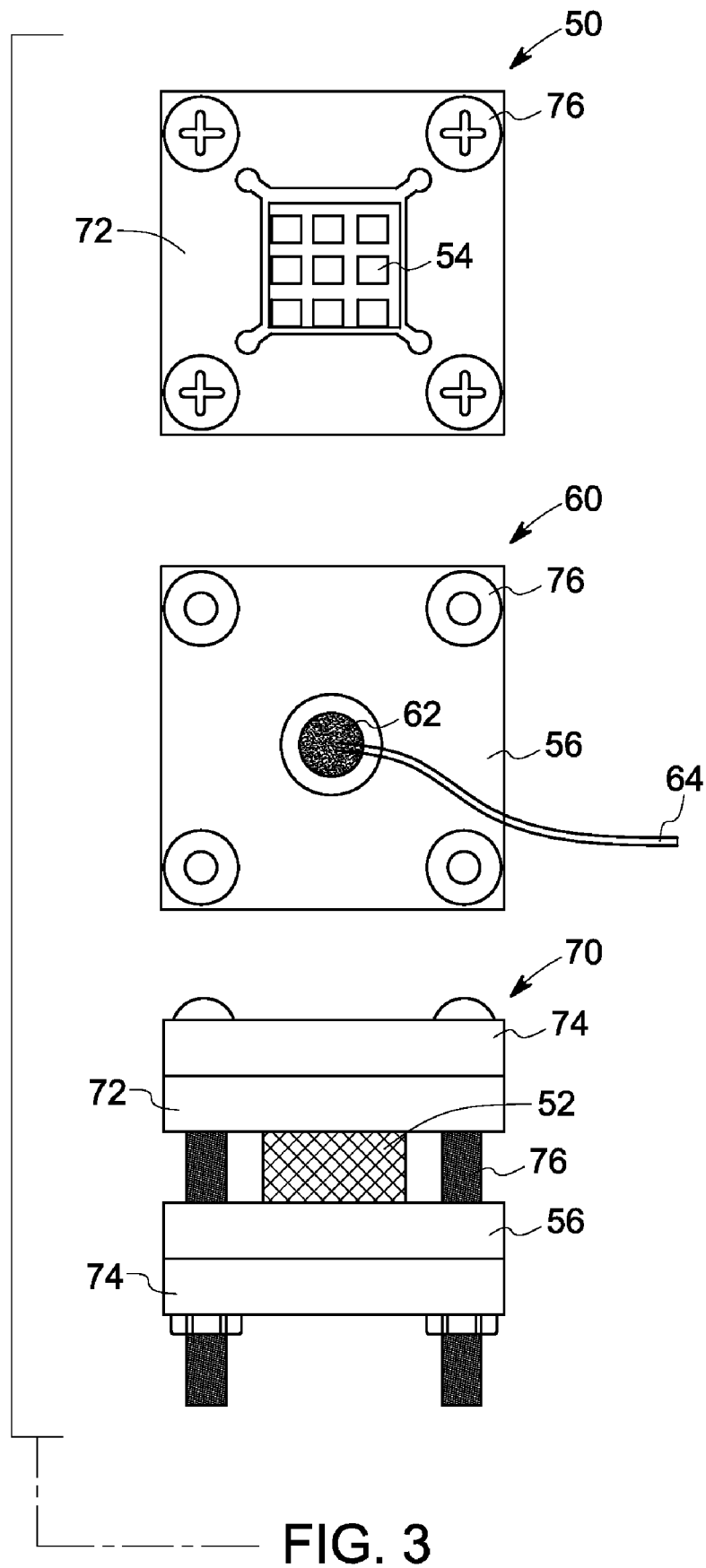
FIG. 3 is a schematic representation of an electronic package module in accordance with one embodiment of the present invention.

A $Cd_{0.9}Zn_{0.1}Te$ crystal of size about 1.5 cm×1.5 cm×2.0 cm was sputtered with gold covering the top surface in the form of a pixelated 3×3 electrode grid and completely covering the bottom surface. FIG. 3 schematically represents the top view 50, bottom view 60 and a side view 70 of the assembly of the $Cd_{0.9}Zn_{0.1}Te$ crystal along with the other elements of the package. The pixelated 3×3 grid of gold electrode 54 that can be connected to an external circuitry is visible in the top view 50.

The $Cd_{0.9}Zn_{0.1}Te$ crystal 52 was inserted into the top PTFE plate 72 that contained a square recess to allow the crystal to be seated. The bottom PTFE plate 56 was centered and placed against the bottom surface of the crystal. The bottom PTFE plate 56 contains a cylindrical through-hole (i.e., cavity 16), such that the surface in contact with the crystal protrudes as a circular lip that terminates in a "knife" edge.

Rigid plates 74 of polycarbonate plastic were introduced on the outer surfaces of the top 72 and bottom 56 PTFE plates to allow uniform pressure across the PTFE plates. The top and bottom rigid plates 74 and the top 72 and bottom 56 PTFE plates were connected through the screws 76. While the compliance of PTFE prevented damage to the crystal, the compliant knife edge of the bottom PTFE plate 56 deformed, creating a leak-proof seal for the liquid contact material 20.

Separately, the materials Ga, In, and Sn were added, respectively, in the atomic ratio of 68.5, 21.5, and 10 to a PTFE container (not shown) and melted at 100° C.-120° C. in a convection oven. The resulting liquid alloy was deposited into the cylindrical cavity of the bottom PTFE plate 56, at room temperature, thus forming the liquid contact material 20. A gold-coated copper material 62 was inserted into the cavity, becoming the bottom contact. The gold-coated copper material 62 had a dome-shaped top end and electrical leads 64 soldered to the bottom end.

Figure 4:
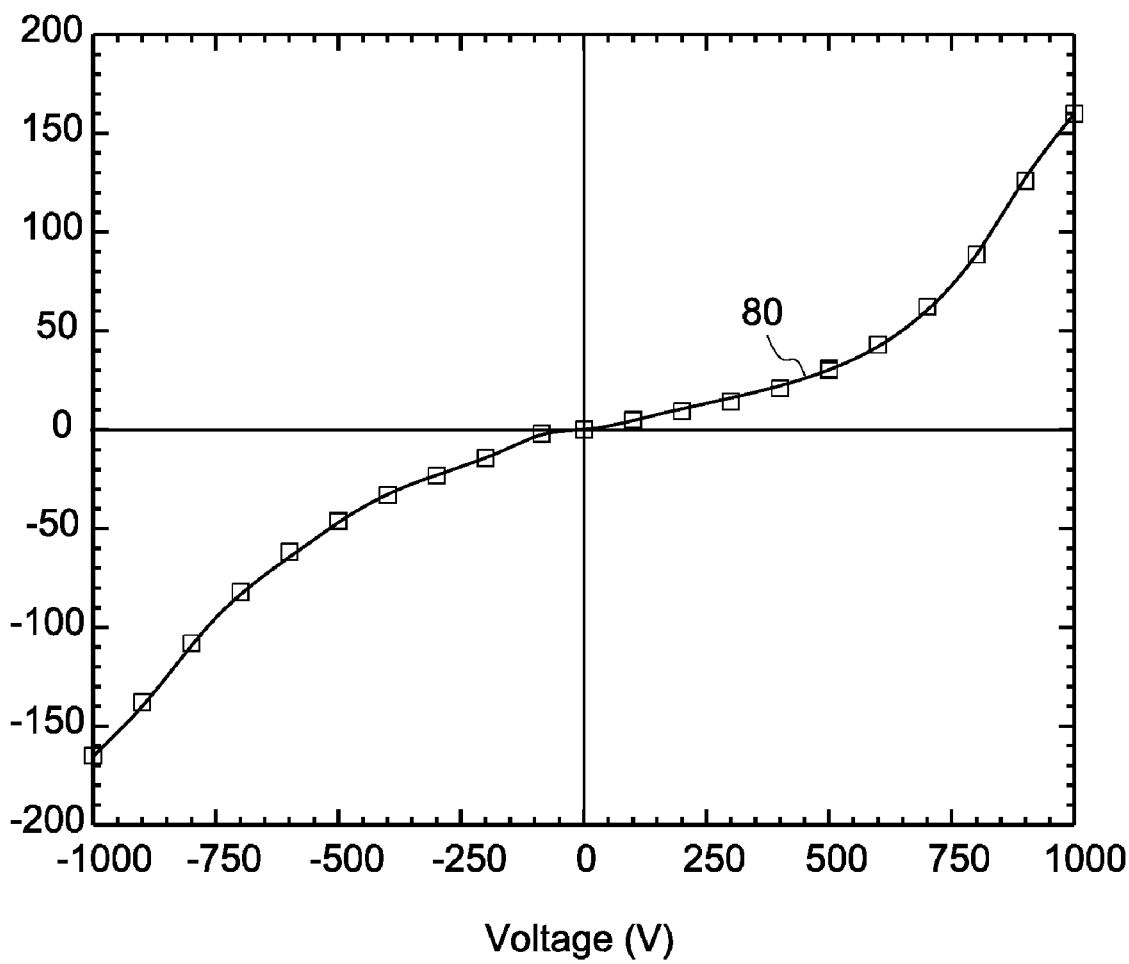
FIG. 4 is a graphical representation of the I-V characteristics of a semiconductor crystal subjected to an electronic package in accordance with one embodiment of the present invention.

FIG. 4 depicts the current-voltage (I-V) curve 80 of the above-described contact configuration. The graph shows the generally expected I-V characteristics of a semiconducting crystal thereby indicating that the package/contact design of the present invention did not distort the I-V characteristics of the electronic element.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An electronic package, comprising:
   at least one module, comprising:
   an electronic element;
   a bottom electrode in electrical communication with the electronic element;
   a liquid contact material in electrical communication with the bottom electrode
   a bottom contact;
   a fluid retention body a portion of the liquid contact material and configured to form and maintain integrity of electrical pathway through the liquid contact material regardless of displacements or torsions operating on the module,
   wherein the liquidus temperature of the liquid contact material is less than about 0° C. and wherein the liquid contact material consists essentially of liquid phase material and the package further comprising a plurality of modules, wherein at least two modules of the plurality of modules are in electrical communication with each other.

2. The package of claim 1, wherein the electronic element comprises a semiconductor crystal.

3. The package of claim 2, wherein the semiconductor crystal comprises cadmium zinc telluride crystal.

4. The package of claim 1, wherein the liquid contact material comprises a single-phase metallic fluid of resistivity equal to or less than about $10^2$ ohm-cm.

5. The package of claim 1, wherein the liquid contact material comprises mercury, a sodium-potassium alloy, a gallium-based alloy, gallium-indium alloy, a gallium-tin alloy, or any combination thereof.

6. The package of claim 5, wherein the liquid contact material comprises a gallium-indium-tin alloy.

7. The package of claim 1, wherein the liquid contact material is in direct electrical contact with the electronic element and the bottom contact.

8. The package of claim 1, wherein the bottom contact comprises a platinum group material, gold, silver, nickel, aluminium, copper, tungsten or any combination with the foregoing.

9. The package of claim 1, wherein the fluid retention body comprises an insulating material.

10. The package of claim 9, wherein the fluid retention body comprises a polytetrafluoroethylene (PTFE) material.

11. The package of claim 1, wherein the fluid retention body is mechanically configured to form a pressure seal with the electronic element.

12. The package of claim 1, wherein the bottom electrode comprises a platinum group material, gold, silver, nickel, aluminium, copper, tungsten or any combination with the foregoing.

13. The package of claim 1, further comprising a top electrode and a bottom contact electrode connected to an external circuitry.

14. The package of claim 1, wherein the plurality of modules is arranged in the form of an array.

15. An electronic package, comprising:
    a module comprising:
    a top electrode connected to an external circuitry;
    a semiconductor crystal in electrical communication with the top electrode;
    a bottom electrode in electrical contact with the semiconductor crystal;
    a bottom contact;
    a bottom contact electrode connected to the bottom contact and an external circuitry;
    a gallium-based liquid contact material in electrical communication with the bottom electrode and the bottom contact, wherein the liquid contact material consists essentially of liquid phase material;
    a fluid retention body of PTFE material containing a portion of the liquid contact material and configured to form and maintain integrity of electrical pathway through the liquid contact material regardless of displacements or torsions operating on the module and the package further comprising a plurality of modules, wherein at least two modules of the plurality of modules are in electrical communication with each other.

* * * * *